United States Patent
Hohlfelder et al.

(10) Patent No.: US 8,444,770 B2
(45) Date of Patent: May 21, 2013

(54) SYSTEM FOR CLEANING COMPONENTS FOR FILLING HOLES IN A PRINTED CIRCUIT BOARD WITH A FLUID FILL MATERIAL

(75) Inventors: Tadd Hohlfelder, Fall Creek, WI (US); Brad Moran, Chippewa Falls, WI (US); Rubin Matthews, Jim Falls, WI (US); Thomas Gannon, Chippewa Falls, WI (US)

(73) Assignee: TTM Technologies, Inc., Santa Ana, CA (US)

( * ) Notice: Subject to any disclaimer, the term of this patent is extended or adjusted under 35 U.S.C. 154(b) by 887 days.

(21) Appl. No.: 12/494,240

(22) Filed: Jun. 29, 2009

(65) Prior Publication Data

US 2010/0326473 A1    Dec. 30, 2010

(51) Int. Cl.
*B08B 9/032* (2006.01)
(52) U.S. Cl.
USPC .......... 134/22.18; 134/22.19; 134/22.14; 134/23
(58) Field of Classification Search .......... None
See application file for complete search history.

(56) References Cited

U.S. PATENT DOCUMENTS

| | | | | |
|---|---|---|---|---|
| 2,677,382 | A | * | 5/1954 | Cushing .................. 134/167 R |
| 3,815,820 | A | | 6/1974 | Probst |
| 3,897,336 | A | | 7/1975 | Bydalek et al. |
| 4,222,346 | A | | 9/1980 | Reisgies |
| 4,316,750 | A | | 2/1982 | Gengler |
| 4,534,802 | A | * | 8/1985 | Gates et al. ............ 134/22.12 |
| 4,720,402 | A | | 1/1988 | Wojcik |
| 4,796,560 | A | | 1/1989 | Berger et al. |
| 4,848,641 | A | * | 7/1989 | Park et al. .................. 228/37 |
| 4,961,955 | A | | 10/1990 | Goldberg |
| 4,971,083 | A | | 11/1990 | Stach et al. |
| 5,037,390 | A | | 8/1991 | Raines et al. |
| 5,145,691 | A | | 9/1992 | Kawakami et al. |
| 5,330,101 | A | * | 7/1994 | Turner et al. ............ 427/96.4 |
| 5,332,439 | A | | 7/1994 | Watanabe et al. |
| 5,368,653 | A | | 11/1994 | Russell |
| 5,419,352 | A | * | 5/1995 | Johnson .................. 134/102.1 |

(Continued)

FOREIGN PATENT DOCUMENTS

JP    2004042333    2/2004

OTHER PUBLICATIONS

Vacuum Chamber Plugging VCP 5000-1, product specification dated Sep. 20, 2007 (2 pages), downloaded from http://www.mass-pcb.de/Endlish/vcp100en.html.

*Primary Examiner* — Michael Barr
*Assistant Examiner* — Caitlin N Dunlap
(74) *Attorney, Agent, or Firm* — Greenberg Traurig, LLP

(57) ABSTRACT

A method for cleaning components of a system for filling holes in a printed circuit board with a fluid fill material includes removing the components being a dispensing head and a manifold connected to the dispensing head preferably as a single unit. The single unit is retained in that format. Excess fluid material from the dispensing head and manifold is evacuated preferably by passing air through the dispensing head and manifold. Then the dispensing head and manifold is placed in a cleaning tub, and the manifold is attached to a solvent pump line. The dispensing head and manifold is flushed with a flow of solvent from the solvent pump line; and excess solvent from the dispensing head and manifold is evacuated, by passing air through the dispensing head and manifold.

18 Claims, 6 Drawing Sheets

U.S. PATENT DOCUMENTS

| | | |
|---|---|---|
| 5,480,664 A | 1/1996 | Ferrero |
| 5,485,857 A | 1/1996 | Amundsen |
| 5,615,828 A * | 4/1997 | Stoops ............................ 228/223 |
| 5,766,670 A | 6/1998 | Arldt et al. |
| 5,824,155 A | 10/1998 | Ha et al. |
| 5,830,023 A | 11/1998 | Brogdon |
| 5,904,773 A * | 5/1999 | Himes ............................ 118/314 |
| 5,925,414 A | 7/1999 | Buechele et al. |
| 6,073,817 A | 6/2000 | Jairazbhoy |
| 6,171,399 B1 | 1/2001 | Kaiser et al. |
| 6,264,862 B1 | 7/2001 | Liaw |
| 6,371,137 B1 | 4/2002 | Heath |
| 6,454,154 B1 | 9/2002 | Pedigo |
| 6,626,106 B2 | 9/2003 | Peckham et al. |
| 6,675,994 B2 | 1/2004 | Yamamoto et al. |
| 6,725,769 B1 | 4/2004 | Williams |
| 6,796,339 B1 | 9/2004 | Petty |
| 7,510,127 B2 | 3/2009 | Haji |
| 2003/0063271 A1 | 4/2003 | Nicholes et al. |
| 2004/0007174 A1 * | 1/2004 | Gibson et al. ................. 118/203 |
| 2006/0081727 A1 | 4/2006 | Stepaniak et al. |
| 2006/0214981 A1 | 9/2006 | Fukasawa et al. |
| 2006/0237198 A1 | 10/2006 | Crampton |
| 2007/0006805 A1 | 1/2007 | Cruz |
| 2008/0035177 A1 | 2/2008 | Kleiger et al. |

* cited by examiner

SYSTEM FOR CLEANING COMPONENTS FOR FILLING HOLES IN A PRINTED CIRCUIT BOARD WITH A FLUID FILL MATERIAL

BACKGROUND

The present disclosure relates to placing fill materials into the holes of a substrate, such as placing an electrically conductive, thermally conductive or nonconductive paste into holes within printed circuit boards (PCB), wired circuit boards, hybrid circuit boards, ceramic substrates, and other various laminate and electronic packages and panels.

Vias, holes, or openings are common structures found in PCBs and other electronic panels. The intent is to uniformly fill the plurality of vias or holes on a substrate with a desired fill material.

However, a common issue with the current application systems is the undesirable levels of fill variation, including the lack of fill material in some holes and excessive fill material in others, resulting in substantial material waste. Especially with squeegee print filling systems and processes, fill material flow is often non-uniformly restricted in random holes.

In other application systems, an air pressure action is used to force paste from a paste tube through a dispenser. The dispenser moves across a substrate or panel while dispensing the paste into holes within the panel. These application systems may yield potential defects caused by the preparation of the materials or by the application method itself. With these application systems, it is difficult to reliably place paste in a hole without forming an air pocket or void. This is partially due to variations in the substrate (thickness, hole diameter to be filled, density of holes in any given area across the panel). Fluctuations in the air pressure pushing the fill material also result in erratic rates of paste flow through the dispenser. Another problem is that the paste or fill material within a tube may be introducing variations in viscosity and flow, resulting in uneven application, inadequate and/or excessive fill. For example, the viscosity of the paste in the center of the tube appears to be different than the viscosity of the paste in the beginning of the tube. There is also a concern that the use of air pressure may penetrate, blow-by, or compromise the seal in the paste tube and create air voids in the paste supply.

These issues combine to produce poor quality fill (voiding) within the via or hole and result in an excessive amount of fill material waste and expense while attempting to adequately fill the substrate holes. There can also be excess paste under a leading edge of the dispenser that typically cannot be reused. The excess paste is usually cured and discarded, as there is a potential for paste contamination caused by O-ring debris, catch pans, etc. The excessive material waste creates a need to constantly add more paste to the application systems to replenish the paste volume in the dispenser.

It is important that the vias or holes must be completely filled with paste so that there are no air pockets. If there are voids or air pockets in the paste, these air pockets generally remain in the completed product. A via with a void has several adverse effects. If the paste is placed to provide thermal conductivity, the air of the void acts as an insulator. If the paste is placed to provide electrical conductivity, an opening at the void results in no secondary or fail safe electrical connection being formed. Furthermore, if the via is filled to provide structural integrity, a void in the via results in reduced structural integrity.

Thus there is a need for an improvement to the current hole fill application systems. There is a need for a process and apparatus for uniformly placing fill material with minimal waste into the holes of an electronic substrate such that there are no air pockets formed in the plugged fill material. The process and apparatus needs to be able to form plugged holes in a substrate which have reliable electrical conductivity, thermal characteristics, and/or structural integrity. There is a need for a process and apparatus that improves the yield for forming plugged holes in electronic substrates while lessening the possibility that contaminates will be introduced into the fill material. Furthermore, there is a need for a hole fill process which is controllable and which has a high throughput, such as in a relatively high speed, single pass operation. There is also a need for a effective and time efficient cleaning process and apparatus to clean the hole fill apparatus with minimal disassembly.

SUMMARY

In accordance with one aspect of the present disclosure, a hole fill system is provided. The disclosed system is provided for enhancing the flow of fill material from a pump assembly through a manifold to a dispensing head to fill the holes of a substrate.

In accordance with another aspect of the present disclosure, a system is provided for improving the cleaning process of the manifold and dispensing head assembly.

In one exemplary embodiment, the disclosed system is obtained by replacing and improving various components of a base system produced by MASS GmbH (Germany) and identified as the Vacuum Chamber Plugging, VCP 5000-1™.

DESCRIPTION OF THE DRAWINGS

The above-mentioned features and objects of the present disclosure will become more apparent with reference to the following description taken in conjunction with the accompanying drawings wherein like reference numerals denote like elements and in which.

DETAILED DESCRIPTION

Figure 1:
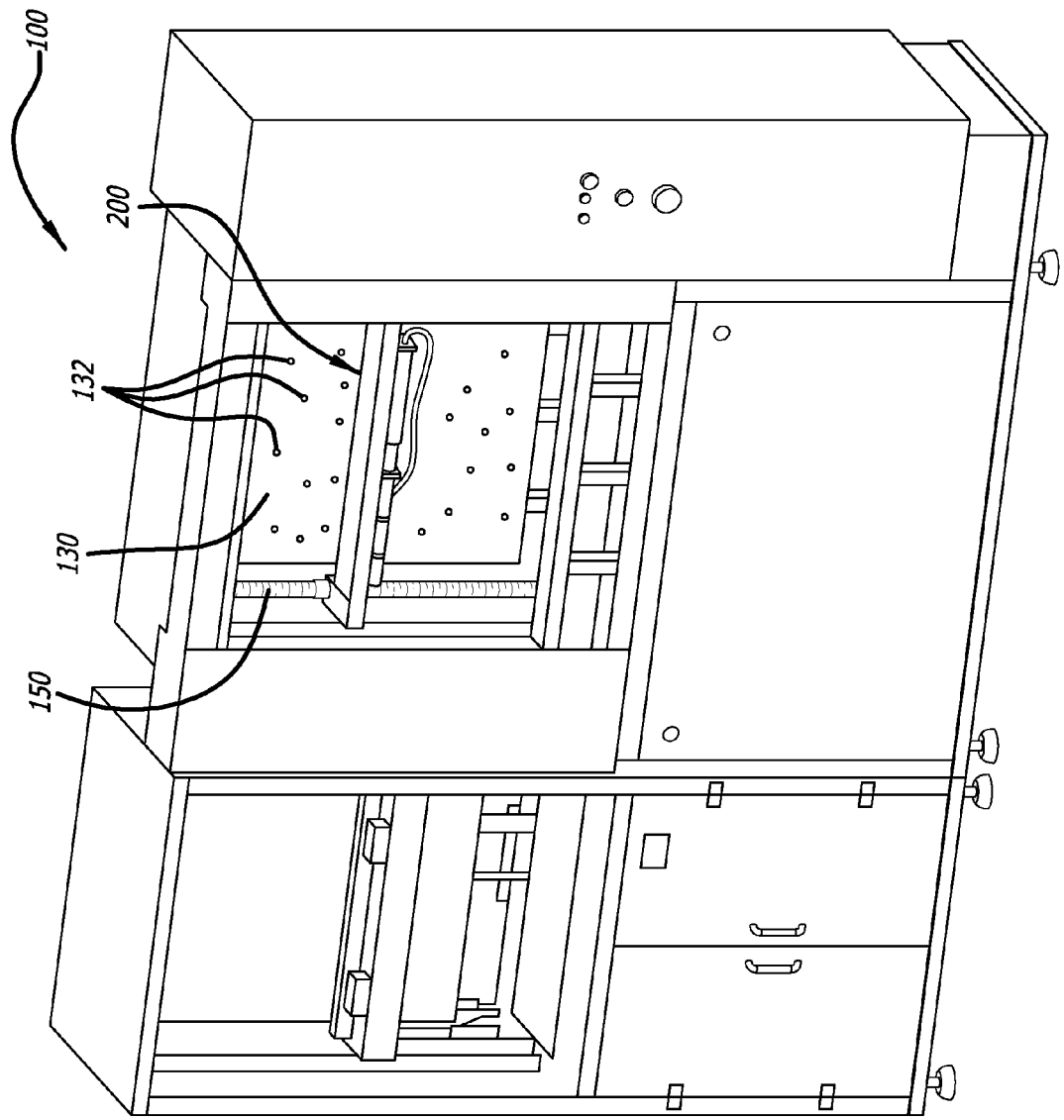
FIG. 1 is a schematic perspective view of a hole fill system for delivering fill material to fill the holes on a substrate.

In the following detailed description of the preferred embodiments, reference is made to the accompanying drawings which form a part hereof, and in which are shown by way of illustration specific embodiments in which the disclosure may be practiced. It is to be understood that other embodiments may be utilized and structural changes may be made without departing from the scope of the present disclosure.

Devices and methods are disclosed for delivering a fill material, such as electrically/thermally conductive paste, and/or electrically/thermally insulating paste, and/or solder paste to a substrate such as an electronics package, PCB or any other electronic planar surface.

There is a system for filling holes in a substrate with a fluid fill material. The system comprises a main body for receiving, preferably vertically, a printed circuit board within the main body. By having the system clamp vertically instead of horizontally, there is a saving of space. The system does not require a pre-routed backer panel. O-rings are used on both sides, namely the fill head and receiving head, to provide an adequate seal. Paste or fill material viscosity is not relied upon to provide an adequate seal, which also results in less tooling, setup, and cleaning time.

A feeding reservoir contains the fill material and has a first end and a second end. In an exemplary implementation, the feeding reservoir is a cylindrical tube of fluid fill material.

An outlet system connects the first end of the feeding reservoir to the dispensing head and allows the fill material to flow from the first end of the feeding reservoir to the dispensing head. The outlet system includes a flow path having a flow line attached to a manifold assembly leading to the dispensing head. The inner diameter of the flow line is sized to accommodate a desired flow of fill material. In one embodiment, the flow line has an inner diameter of 3/8 inch.

The manifold assembly or branch network includes branches that do not have 90° elbows in the flow path. This allows for smoother flow of the fill material and easier cleaning of the manifold assembly compared to flow paths that have 90° elbows. The number of branches and junctions may be varied as desired, depending on various factors such as the size of the dispensing head, the viscosity of the fill material, and the desired flow rate of the fill material in the dispensing head.

In one embodiment, the manifold includes a single channel splitting at a junction into two secondary channels, the two secondary channels each splitting again into two tertiary channels. The total of four tertiary channels are connected at their respective opposite ends to the dispensing head. In one embodiment, there are no 90° elbows and O-rings prior to the junctions where the single channel splits and where the secondary channels split. In other embodiments, in addition to not having 90° elbows and O-rings prior to the junctions, there are also no 90° elbows and O-rings where the tertiary channels are connected to the dispensing head.

In one exemplary implementation, the channels of the manifold comprise of hollow tubes. The hollow tubes may be made of rubber, plastic, or any other material that is preferably inert to the fill material that passes through the tube. In another exemplary implementation, the channels are created within a block or multiple blocks of material, such as aluminum, steel, plastic, or any other material that is preferably inert to the fill material. In one embodiment, a center aluminum block joins together two side aluminum blocks to form a "Y"-shaped manifold. Smooth channels with no 90° elbows are formed within the aluminum blocks manifold. The diameter of the channels are sized to accommodate a desired flow of fill material. In one embodiment, the channels have diameters of 3/8 inch. The channels are also preferably highly polished to provide enhance flow of the fill material. A single channel splits into two secondary channels within the center aluminum block, each secondary channel connecting to a respective side aluminum block. The secondary channel splits into two tertiary channels within each side aluminum block. The total of four tertiary channels are connected to the dispensing head. In other exemplary implementations, a combination of tubes and channeled blocks is used to form the manifold.

A plunger is located at the second end of the feeding reservoir. An air cylinder driven system acts as a pressure source to push the plunger into the feeding reservoir, thereby forcing the fill material out of the first end of the feeding reservoir and into the dispensing head. The air cylinder driven system provides a steady and consistent pressure forcing the fill material from the feeding reservoir, through the outlet system, and out of the dispensing head. In one exemplary implementation, a SMC™ air cylinder is used. Specific software may be used with the hole-fill system to control the pressure generated by the air cylinder.

The pressure source may include one or more hydraulic, pneumatic or mechanically driven pressurizing cylinders, and may include a ram press for back-filling paste vessels. Back-filling is desirable to prevent air entrapment during the paste loading process. The paste flow is also controlled with a vacuum pressure release valve. In some embodiments, a controlled output ultrasonic driver is attached to the dispensing head. An output control mechanism is used with the ultrasonic driver.

A dispensing head is coupled to the source of pressurized fill material by a fill material inlet. The dispensing head includes a main body or pressure chamber and a gasket or wear element positioned along the surface of the dispensing head. The dispensing head dispenses the fill material that flows into the main body from a plurality of inlets. The plurality of fill material inlets share a common orientation and are directed away from the outlet system. In an exemplary implementation, the dispensing head also includes a flow dispersion regulator which includes a punctured feed tube positioned within the main body, the punctured feed tube having a plurality of flow regulating openings. The flow regulating openings in the punctured feed tube are sized to maintain a substantially constant pressure at each of the flow regulating openings.

Positioned on the surface of the main body of the dispensing head is a flow equalization grid. The flow equalization grid includes a multiplicity of openings or fill material outlets. In an exemplary implementation, the dispensing head comprises a plurality of elongated outlets and the dispensing mechanism disperses fill material along the length of each outlet of the plurality of outlets.

There is also a method for cleaning the components of a system for filling holes in a substrate with a fill material. A dispensing head and a manifold connected to the dispensing head is removed preferably as a single unit. The single unit is retained in that format. Excess fluid material from the dispensing head and manifold is evacuated preferably by passing air through the dispensing head and manifold. The single unit comprising the dispensing head and manifold is placed in a cleaning tub, and the manifold is attached to a solvent pump line. The dispensing head and manifold is flushed with a flow of solvent from the solvent pump line. Excess solvent from the dispensing head and manifold is evacuated by passing air through the dispensing head and manifold.

Overview

Figure 3:
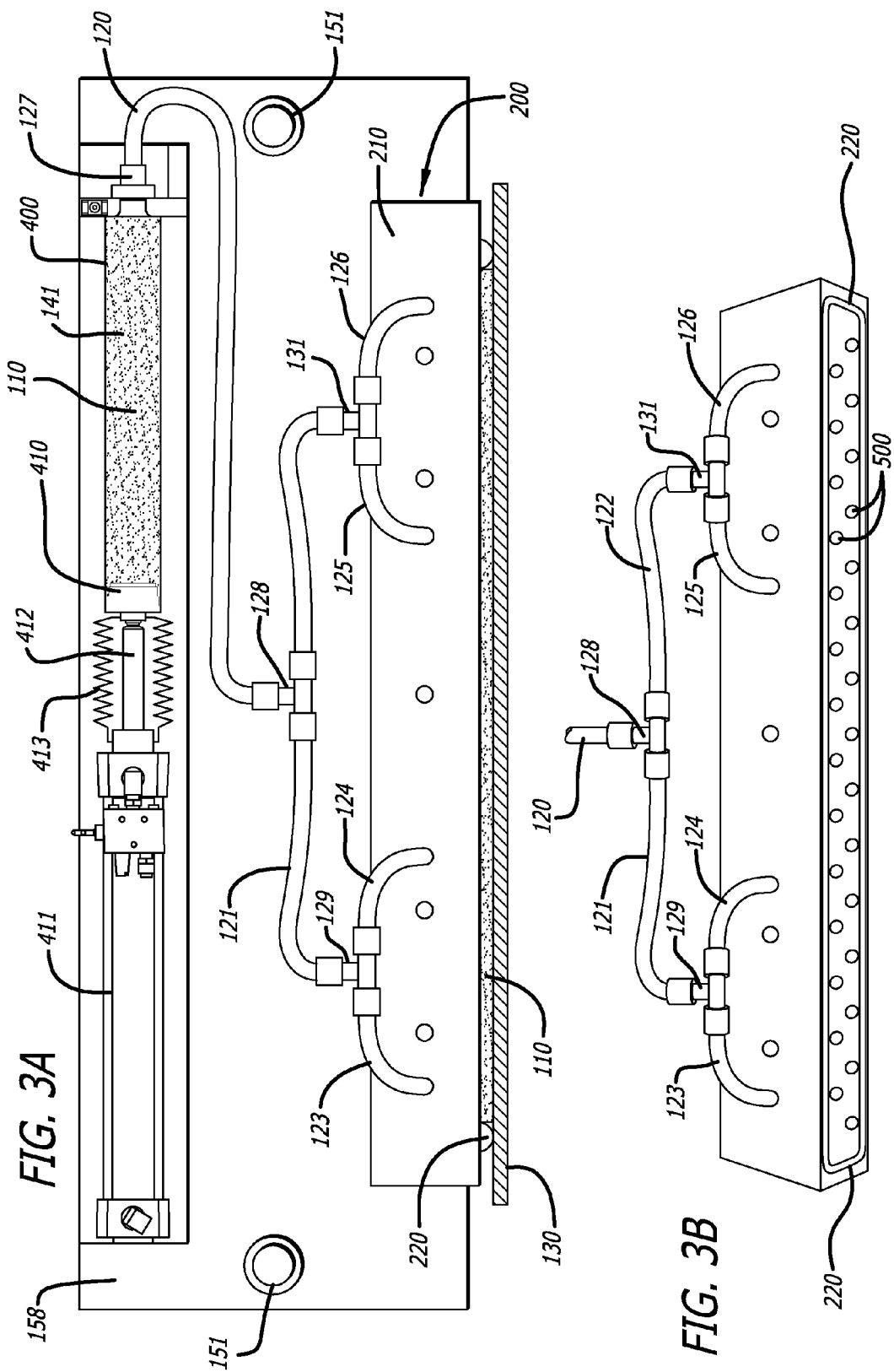
FIG. 3A is a view of components of the hole fill system, including a feeding reservoir, outlet system, manifold, and dispensing head.
FIG. 3B is a view of the dispensing head and the manifold of the hole fill system of FIG. 2.

FIG. 1 is a schematic perspective view of a hole fill system 100 for delivering fill material 110 to fill the holes 132 on a substrate 130. The system 100 includes a main body for receiving a vertically placed substrate 130 within the main body. There is a dispensing head 200 for selectively dispensing the fluid fill material 110 onto the vertically placed substrate 130, the dispensing head 200 having a plurality of holes 500, as shown in FIG. 3B. The hole fill system 100 of the first embodiment includes a mechanism 150 for moving the dispensing head 200. The system also comprises a head parking mechanism and a substrate support structure 180.

Figure 2:
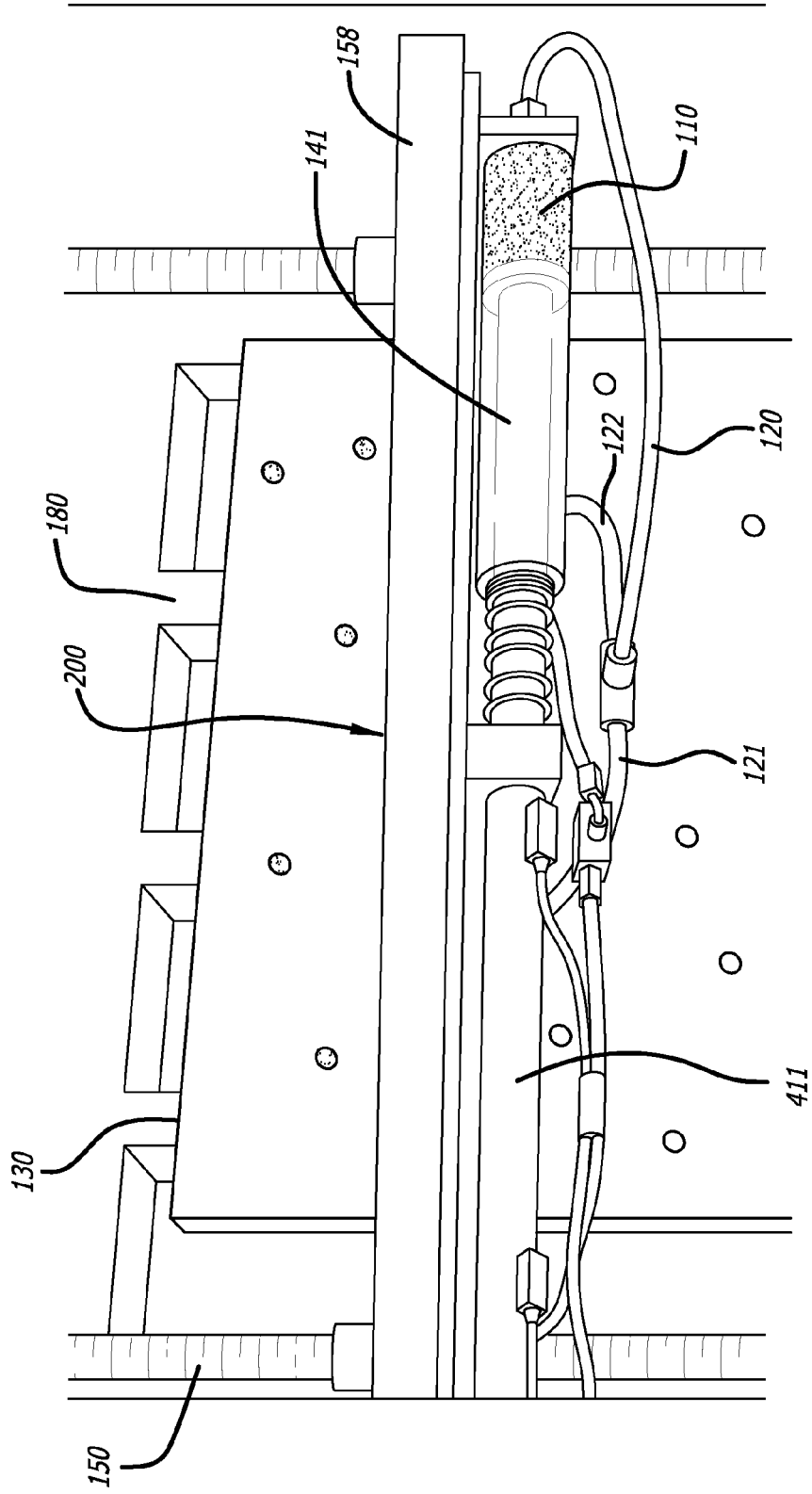
FIG. 2 is a second view of the hole fill system of FIG. 1.

As shown in FIG. 2, the dispensing head 200 is placed in contact with and moved along substrate 130 by movement mechanism 150 while fill material is forced through dispensing head 200 and into the holes 132 contained in substrate 130. Substrate support structure 180 supports the substrate 130 and head parking mechanism helps prevent loss of fill material between passes of dispensing head 200 along substrate 130.

As shown in FIG. 3A, a feeding reservoir 400 contains fill material 110 and has a first end and a second free end 127. The feeding reservoir 400 is preferred to comprise a pressure chamber such as pressure chamber or paste tube 141 attached to the transverse support member 158. Pressure at which the feeding reservoir provides fill material may be referred to hereinafter as the fill material pressure.

The feeding reservoir 400 of the hole fill system 100 includes a backplated ram press chamber which comprises a paste tube 141 having therein a plunger or cylinder 410. The plunger 410 is located towards the second end of the feeding reservoir. The action of the cylinder or plunger 410 is under the force of an air cylinder 411 which is mechanically linked to the plunger 410 through rod 412. There is a collapsible sock 413 about the rod 412 to keep the mechanism sealed against inadvertent ingress of impurities into the system. The air cylinder 411 pushes the plunger 410 into the feeding reservoir 400, thereby forcing the fill material 110 out of the free end 127 of the feeding reservoir 400 and into the dispensing head 200.

The control for pressure can be two way. During a print stroke or when paste is provided to the dispensing head 200, pressure is applied to the plunger. When the print stroke is complete, the dispensing head 200 moves to a staging or parked area. The flow of pressurized fill material 110 can be reversed by placing a slight vacuum on the plunger 410 so that the fill material within the paste tube, the outlet system, as well as the dispensing head 200 retracts slightly. This prevents waste of fill material 110.

In other variations, some of the embodiments may be combined in an embodiment which utilizes a stepping motor in addition to or as a supplement to the air pressure cylinder system 411 to move a plunger 410. The stepping motor can move the plunger 410 to force fill material 110 out of chamber 400 and through flow line 120.

Although fill material 110 may comprise any material which can be used to pressure fill the holes of a substrate, it is contemplated that the use of electrically conductive or nonconductive and/or thermally conductive or nonconductive pastes may be particularly advantageous, particularly in instances where the substrate comprises an electronics package member.

An outlet system of channels and couplings connect the end 127 of the feeding reservoir to the dispensing head 200. The outlet system comprises a flow line 120 connected to the first end 127 of the feeding reservoir. In one embodiment, free end 127 from the chamber 141 is connected to the flow line 120 without there being any right angular elbows or O-rings in the line. The single tube provides smooth laminar flow for the fill material from the first end of the feeding reservoir to a manifold assembly.

The outlet system comprises a flow line 120 and in one exemplary implementation, as shown in FIGS. 3A and 3B, a manifold of secondary branch tubes 121 and 122 and tertiary branch tubes 123, 124, 125, and 126. The manifold includes a T-piece 128 which splits the outlet from flow line 120 into the two secondary branches 121 and 122. This is no right angular elbow in front of the T-piece 128. There are also no right angular elbows in lines 121 and 122, and the downstream ends of those lines 121 and 122 connect respectively with T-pieces 129 and 131. There are no right angular elbows in front of the T-pieces 129 and 131 and secondary branches 121 and 122 split into tertiary branches 123, 124, 125, and 126. The lateral free ends of tertiary branches 123 to 126 connect directly with the inlets of dispensing head 200 without any right angular elbows.

Figure 6:
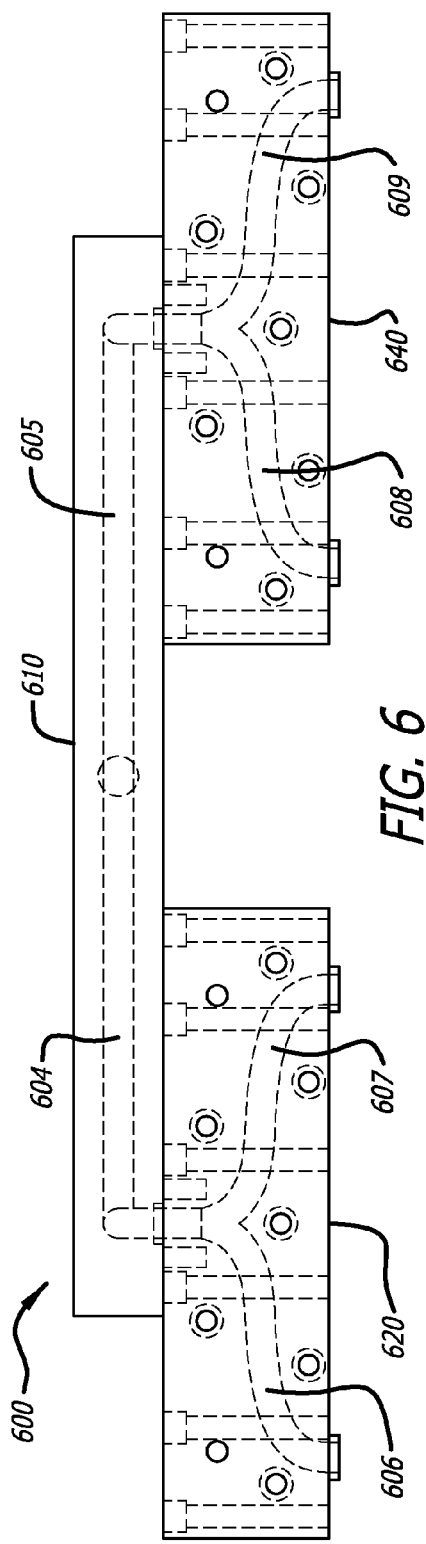
FIG. 6 is a view of a second embodiment of a manifold and the channels provided by the manifold.
Figure 7:
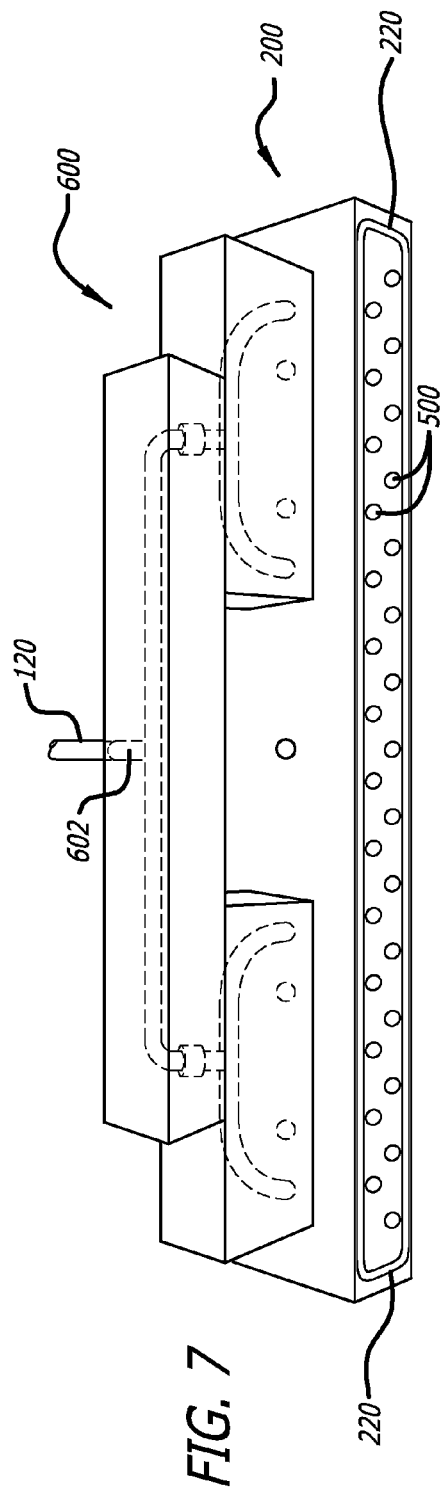
FIG. 7 is view of the second embodiment of the manifold of FIG. 6 and the channels provided by the manifold connected to a dispensing head.

In another embodiment, there is a 90 degree elbow connecting flow line 120 to outlet 127 to facilitate equipment clearance. FIG. 6 and FIG. 7 show an alternative embodiment of a manifold comprised of blocks of material having smooth channels with no 90° elbows created within. A center block 610 joins together two side blocks 620, 640 to form a "Y"-shaped manifold 600. A single channel 602 splits into two secondary channels 604, 605 within the center block 610 and each secondary channel is connected to a side block 620, 640. The secondary channel splits into two tertiary channels within each side block. The four tertiary channels 606, 607, 608, and 609 are connected to the dispensing head 200.

As shown in FIGS. 3A and 3B, the dispensing head 200 includes a main body portion 210 and an O-ring or gasket 220 that surrounds a flow grid 500. There can also be a flow dispersion regulator passing through main body 210.

The main body 210 and the gasket 220 may be made from any suitable materials, but are preferably made from materials that will remain inert with respect to the fill material/via fill paste that will pass through the dispensing head 200. Examples of such materials include, but are not necessarily limited to, machine-anodized aluminum, stainless steel, solvent-resistant polymer, and Teflon-impregnated Delrin. In less preferred embodiments, main body 210 and/or gasket 220 may comprise a composite of materials and/or pieces.

It is contemplated that the gasket 220 should be made of a material that has suitable wear characteristics, yet will seal when a fairly low force is applied by the dispensing head to the surface of the electronics package. The gasket is preferably machined from Teflon or cast in a mold with 40 to 120+ durometer hardness polymer, or silicon rubber. The gasket can be resurfaced and configured in various lengths and shapes to accommodate different sized print areas for injecting fill material to various configurations of holes in electronic packages or substrates.

There is a mechanism for moving the dispensing head 200 that includes a transverse support member 158, rails, coupling members, and a guided head support mechanism. The mechanism also includes pneumatic movers attached to sides of a guided head support. The pneumatic movers are used to control the movement of the dispensing head 200 with respect to the support member 158, and are also used to control the amount of force or pressure between the dispensing head 200 and the plate 130. Specific software may be used with the hole-fill system to control the speed of the dispensing head moving along the substrate.

There are screw threaded bars 150 which operate through threaded apertures 151 to guide the dispensing head upwardly and downwardly in the mechanism 100 and provide support to the head support 158. The support member 158 is threadingly movable along the threaded rods 150 which inter-engage in the apertures 151.

In alternative embodiments the dispensing head 200 can be attached to any common screen-printing machine via a transverse bar on the printers which replaces support member 158.

The head 200 must be mounted to the movement mechanism in such a way as to provide uniform planarity with the substrate or surface to be processed. Bearing blocks and rails by providing support to guided head support help prevent "wobbling" of guided head support as it is moved up and down by movers.

Operation

A substrate 130 is positioned with a support structure 180, and the hole fill system is slid up against substrate 130. When thus positioned, the system protects any tooling holes near the edge of substrate 130 which are not to be filled, and provides a mechanism by which the dispensing head 200 may be moved onto and from the substrate 130 with minimal loss of fill material 110.

Once the substrate is positioned, the dispensing head is positioned so that the gasket 220 is in sealing contact with substrate 130 and surrounds one or more holes 132. Positioning the gasket in contact with substrate 130 is accomplished via pneumatic movers which maintain a specific force between the gasket 220 and the substrate 130, and by movement of support member 158 along rails or rods 150.

Pressure is then applied to the source of fill material so as to cause the fill material to flow through channels and connectors, through dispensing head 200, out of grid openings 500, as shown in FIG. 3B and FIG. 7, and into holes 132. More specifically, the pressure mechanism 411 produces a pressure within the flow line 120 which is attached to the multiple channels forming a manifold linkage to the dispensing head 200. The pressurized fill material flows through the channels and connectors into the dispensing head 200. In some embodiments, the fill material flows through a flow dispersion regulator in the main body of the dispensing head. The pressure is equalized by orifices or openings within the flow dispersion regulator in the main body. After entering the dispensing head, the fill material then flows through a flow-equalizing grid with openings 500. From openings 500, the fill material flows against the surface of substrate 130 that is sealed against head 200, and into holes 132.

As the holes 132 are filled, the dispensing head is moved to another location on the substrate 130 where there are additional holes. Such movement is accomplished as engagement between dispensing head 200 and substrate 130 and flow of pressurized fill material 110 is maintained, and the support member is moved along the rails to cause the dispensing head 200 to move down the panel 130. As the head 200 remains in engagement with substrate 130, a more or less continuous amount of pressurized fill material 110 flows from the pressure source through the channels and connectors and into the dispensing head 200 for injection into the holes 132 within the substrate 130.

While the dispensing head 200 is positioned operatively, the substrate 130 that has its desired holes filled is removed from the support structure and another substrate is placed on the support structure. The process for filling the holes then repeats.

The fluid pressure of the fill material 110 and vacuum release can be controlled either manually or by tying it to a stop-activated switch set to specific substrate print length. In another embodiment, a machine vision system can be substituted for the stop-activated switches. The machine vision system would produce a signal when the selected hole pattern area has been filled.

In alternative embodiments, dispensing head 200 may be positioned so that fill material 110 is forced into holes 132 of substrate 130. The panels or electronics packages 130 are pulled over an dispensing head 200 and then exit on the opposing side where the panel or electronic package is removed and a fresh panel is loaded for hole filling in a continuous fashion. This second embodiment will have a high throughput since plates or electronics packages can be continuously fed and filled using this system. The dispensing head 200 does not move as much as in the first embodiment. In the second embodiment, the dispensing head 200 moves up and down or into and out of engagement with the substrate 130. The substrates are moved over the dispensing head 200 as the holes are filled.

The dispensing head moves by activating a pneumatic, two-sided pressure cylinder having adjustable travel of approximately 1 to 3 inches to meet the panel surfaces or electronic package 130 surfaces to be filled. The two sided pressure cylinder is attached to a guided head supporting bar as is dispensing head 200. Scavenger blades can be positioned on either side of the substrate 130.

Advantageously, the hole fill system of the present disclosure is preferably an apparatus which employs a method for placing fill material into holes in electronic packages so that there are reduced numbers of air pockets formed in the fill material. The hold fill system decreases the amount of processing time required per board, provides for the use of a wider variety of fill materials, and minimizes wastage and contamination of fill material. In addition, if air pockets are formed, the air pockets have less volume than the air pockets or voids formed using other methods. As a result, the apparatus and related process result in plugged holes which are reliable electrical contacts and have favorable thermal characteristics, and the process has improved yields for electronic packages which use plugged holes.

The manufacturing process is controllable and has a relatively high throughput during manufacturing. Such high throughput is obtained by decreasing the amount of process time required per board.

The device can lessen the chances that contaminates will be introduced into the fill material. The reduced chance of introduction of contaminates is contemplated as resulting from providing a sealed flow path for the fill material from the fill material source to the holes being filled.

Furthermore, the device and process can also be used to place fill material in holes having high aspect ratios and small diameter with added control for filling the holes. Fillable holes 132 can have diameters in the range of $2/1000$ths of an inch to $25/1000$ths of an inch in diameter. Preferably the diameters are less than $12/1000$ths of an inch. More preferably the diameters are less than $8/1000$ths of an inch, and most preferably the diameters are less than $6/1000$ths of an inch. In addition, the aspect ratio associated with these holes, i.e. the ratio of the hole depth divided by the hole diameter, that can be filled are from 1:1 to 17:1, depending on material rheology, paste solids loading, and particle size distribution within the fill material used. Preferably the aspect ration is greater than 5:1. More preferably the aspect ratio is greater than 10:1, and most preferably the aspect ration is greater than 12:1.

The pump assembly provides a significant level of improvement relating to hole fill consistency and quality within the filled holes. Furthermore, it has also shown a large reduction in fill material waste. For example, using Taiyo paste on an 11.2:1 aspect ratio design, conventional hole fill systems only yielded 3 panels from each tube of paste. The disclosed arrangement yields 13 panels from each tube of paste. This is an improved paste utilization by 4.333 times. This is a substantial savings in material costs. Furthermore, the resulting paste application on the panel may no longer require a scavenging operation to remove excess paste. This provides labor and productivity savings.

Advantageously, the hole fill system utilizes a lower fill material pressure to fill holes. It should be noted that substrate 130 can be of any type. For example, plates or electronics packages containing holes may be used even if such plates or packages comprise laminates or ceramics. In addition, holes in wired circuit boards may also be filled using one or more of the embodiments discussed herein.

Panels that have dot plating, namely button plating patterns can be filled using the disclosed system, which was previously not possible since the copper dots would chew up the Teflon faceplate and excessive amounts of paste would exit. The disclosed hole fill system (including the air cylinder, manifold, etc.) results in 80% less paste waste than in prior art systems.

Cleaning Operation

Figure 4:
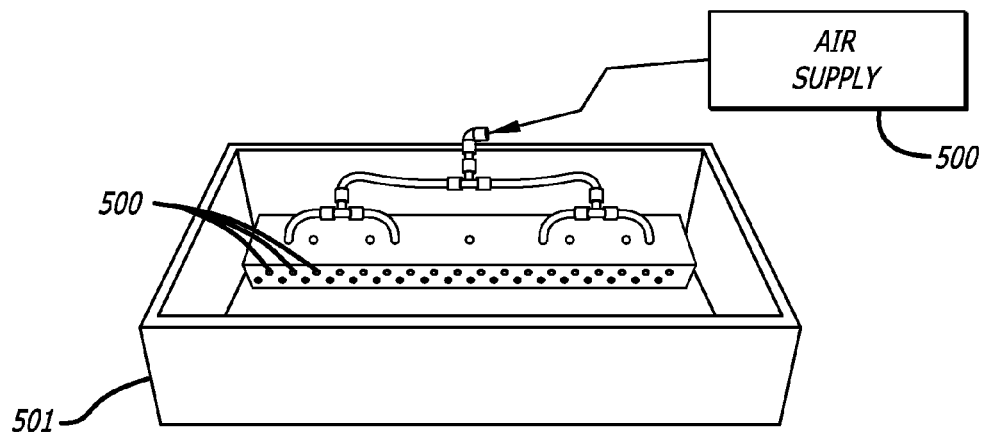
FIG. 4 is a view of the dispensing head and manifold of the hole fill system of FIG. 2, the dispensing head and manifold having been removed as a single unit and placed within a basin to be connected to an air supply.

The method for cleaning components of a system for filling holes 132 in a substrate 130 with a fill material 110 comprises the steps of removing the components being a dispensing head 200 and a manifold of channels and connectors connected to the dispensing head 200. As shown in FIG. 4, excess fill material is first evacuated from the dispensing head and manifold by passing air from an air supply 500 through the dispensing head 200 and manifold of connectors and tubes. At this stage the dispenser and manifold can be in a basin 501.

Figure 5:
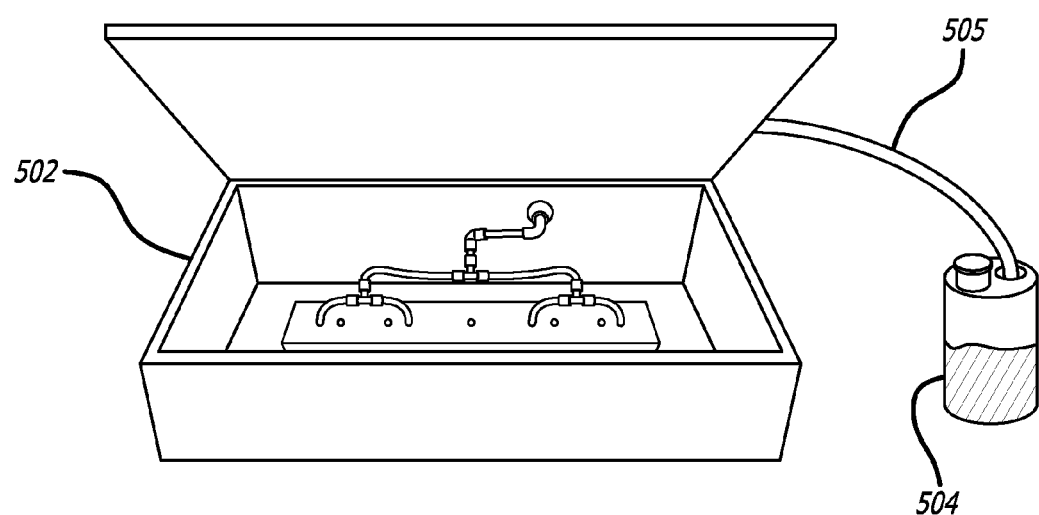
FIG. 5 is a view of the dispensing head and manifold in the hole fill system of FIG. 2, the dispensing head and manifold having been removed as a single unit and placed within a cleaning box. The manifold inlet is connected to an inlet port inside a cleaning box that is connected to a solvent container.
Figure 8:
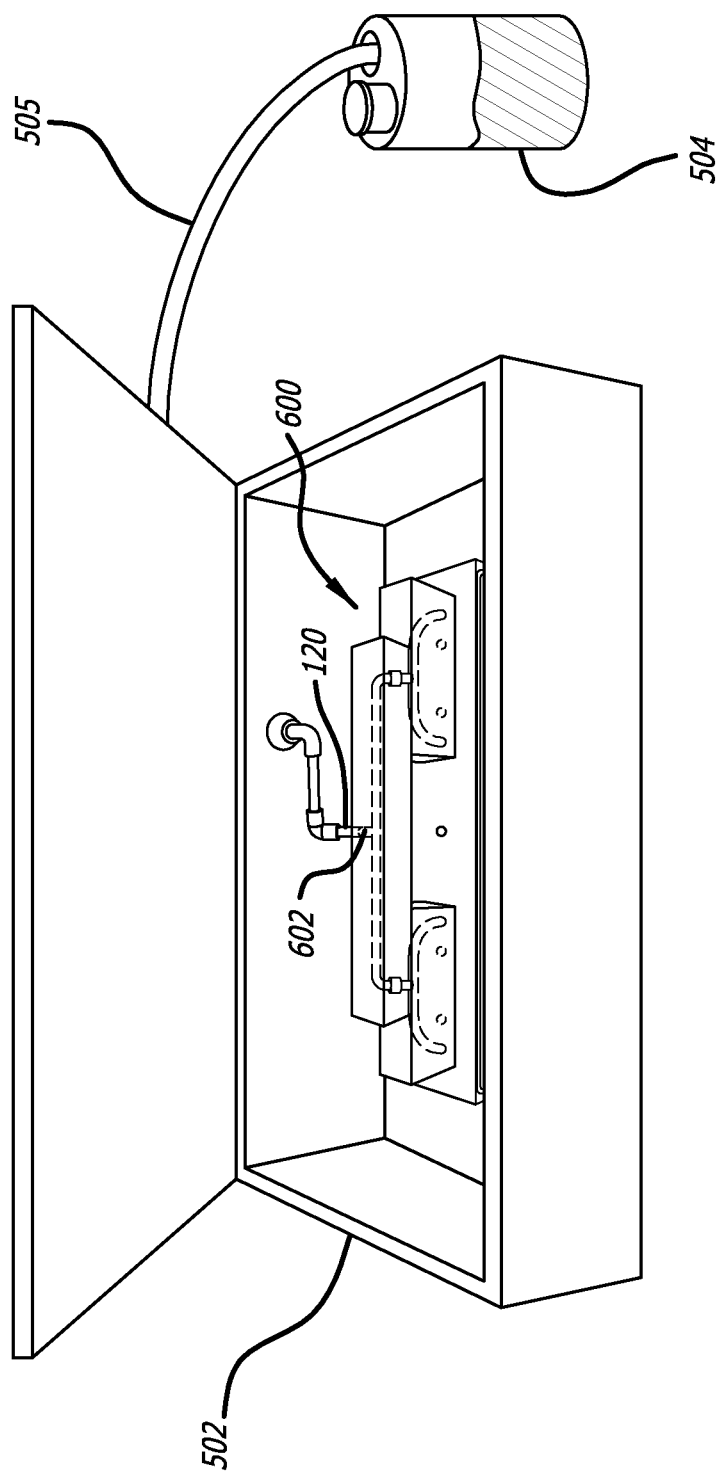
FIG. 8 is a view of the dispensing head and manifold of the hole fill system of FIG. 7, the dispensing head and manifold having been removed as a single unit and placed within a cleaning box. The manifold inlet is connected to an inlet port inside a cleaning box that is connected to a solvent container.

As shown in FIG. 5 and FIG. 8, the dispensing head 200 and manifold are then placed in a cleaning tub 502. A solvent pump line 505 connected to a solvent supply 504 is attached to the manifold. The dispensing head 200 and the manifold system is flushed with a flow of solvent from the solvent pump line 505. In one exemplary implementation, the outlet for the solvent line 505 is connected to a nipple provided in a wall in the tub 502 so that a circuit is made with solvent supply 504.

Excess solvent is evacuated from the dispensing head 200 and manifold by passing air through the dispensing head 200 and manifold system as shown in FIG. 4.

The components being the dispensing head 200 and a manifold system connected to the dispensing head can be removed from the hole fill system 100 as a single unit.

The manifold system includes channels and connectors to the dispensing head. The manifold system includes a flow path having the single flow line attached to a branch manifold network leading to the dispensing head. In one embodiment, the single flow line branches into two secondary channels, and each secondary channel branches in turn to two tertiary channels. The tertiary channels are attached to the dispensing head without 90° elbows in the flow path. This allows for more thorough and efficient cleaning of the manifold system.

In one exemplary implementation, the manifold system for cleaning can include a single tube splitting at a junction into two tubes, the two tubes being connected at their respective opposite ends to the dispensing head. In another exemplary implementation, the manifold system for cleaning can include a block or multiple blocks of material with channels created within. In other cases, the manifold system to be cleaned can have a different manifold of tubes, channels, and connectors. The manifold can have different formats and shapes of connectors.

It is to be understood that the above description is intended to be illustrative, and not restrictive. Many other embodiments will be apparent to those of skill in the art upon reviewing the above description. The scope of the disclosure should, therefore, be determined with reference to the appended claims, along with the full scope of equivalents to which such claims are entitled.

The invention claimed is:

1. A method for cleaning components of a system for filling holes in a printed circuit board with a fluid fill material, the method comprising the steps of:
   removing the components being a dispensing head and a manifold connected to the dispensing head, the removal being to separate the components from the filling system;
   coupling a supply line for air to the manifold and placing the dispensing head and manifold in a first container;
   firstly evacuating excess fill material from the dispensing head and manifold by passing air through the dispensing head and manifold while in the first container;
   placing the dispensing head and manifold in a cleaning tub, the cleaning tub being different to the first container;
   attaching the manifold to a solvent pump line through a nipple attached to the cleaning tub;
   secondly flushing the dispensing head and manifold with a flow of solvent from the solvent pump line;
   removing the manifold and dispensing head from the cleaning tub;
   re-coupling the supply line for air to the manifold and re-locating the dispensing head and manifold in the first container; and
   thirdly evacuating excess solvent from the dispensing head and manifold by passing air through the dispensing head and manifold.

2. The method as claimed in claim 1 wherein the manifold includes a single channel splitting at a junction into two channels, the two channels being connected at their respective opposite ends to the dispensing head.

3. The method as claimed in claim 2 wherein a connection with the dispensing head is at a location towards the respective ends of the dispensing head.

4. The method as claimed in claim 1 wherein the manifold is connected to the solvent pump line and includes channels and connectors to the dispensing head, the channels and connectors having different branches, and wherein the channels include a first channel, branching to two secondary channels, and wherein each secondary channel branches in turn to two tertiary channels, and wherein the four tertiary channels are attached to the dispensing head, and wherein at least some of the junctions between adjacent channels are formed in a non-right-angular relationship with adjacent channels.

5. The method as claimed in claim 4 wherein the manifold comprises a center block and a plurality of side blocks having channels within, the center block being connected to the solvent pump line, and wherein a first channel branches to two secondary channels within the center block, each secondary channel being connected to a side block and branching in turn to two tertiary channels within the side block, the four tertiary channels being connected to the dispensing head, and wherein at least some of the junctions between adjacent channels are formed in the absence of a right-angular relationship with adjacent channels.

6. The method as claimed in claim 1 wherein an outlet system includes a flow path having the solvent pump line attached to a manifold leading to the dispensing head, the manifold including connectors between the channels and with the absence of 90° elbows in the flow path.

7. A method for cleaning components of a system for filling holes in a printed circuit board with a fluid fill material, the method comprising the steps of:
   removing the components being a dispensing head and a manifold connected to the dispensing head as a single unit, the removal being to separate the components from the filling system;

coupling a supply line for air to the manifold and placing the dispensing head and manifold;

firstly evacuating excess fill material from the dispensing head and manifold by passing air through the dispensing head and manifold;

placing the dispensing head and manifold in a cleaning tub;

attaching the manifold to a solvent pump line through a nipple attached to the cleaning tub;

secondly flushing the dispensing head and manifold with a flow of solvent from the solvent pump line;

removing the manifold and dispensing head from the cleaning tub;

re-coupling the supply line for air to the manifold; and thirdly evacuating excess solvent from the dispensing head and manifold by passing air through the dispensing head and manifold.

8. The method as claimed in claim 7 wherein the manifold includes a single tube splitting at a junction into two tubes, the two tubes being connected at their respective opposite ends to the dispensing head.

9. The method as claimed in claim 8 wherein a connection with the dispensing head is at a location towards the respective ends of the dispensing head.

10. The method as claimed in claim 7 wherein the manifold is connected to the solvent pump line and includes channels and connectors to the dispensing head, the channels and connectors having different branches, and wherein the channels include a first channel, branching to two secondary channels, and wherein each secondary channel branches in turn to two tertiary channels, and wherein the four tertiary channels are attached to the dispensing head, and wherein at least some of the junctions between adjacent channels are formed in a non-right-angular relationship with adjacent channels.

11. The method as claimed in claim 10 wherein the manifold comprises a center block and a plurality of side blocks having channels within, the center block being connected to the solvent pump line, and wherein a first channel branches to two secondary channels within the center block, each secondary channel being connected to a side block and branching in turn to two tertiary channels within the side block, the four tertiary channels being connected to the dispensing head, and wherein at least some of the junctions between adjacent channels are formed in the absence of a right-angular relationship with adjacent channels.

12. The method as claimed in claim 7 wherein an outlet system includes a flow path having the solvent pump line attached to a manifold leading to the dispensing head, the manifold including connectors between the channels and with the absence of 90° elbows in the flow path.

13. A method for cleaning components of a system for filling holes in a printed circuit board with a fluid fill material, the method comprising the steps of:

removing the components being a dispensing head and a manifold connected to the dispensing head as a single unit; the removal being to separate the components from the filling system;

coupling a supply line for air to the manifold and placing the dispensing head and manifold in a first container;

firstly evacuating excess fill material from the dispensing head and manifold by passing air through the dispensing head and manifold while in the first container;

placing the dispensing head and manifold in a cleaning tub;

attaching the manifold to a solvent pump line through a nipple attached to the cleaning tub;

secondly flushing the dispensing head and manifold with a flow of solvent from the solvent pump line;

removing the manifold and dispensing head from the cleaning tub;

re-coupling the supply line for air to the manifold and re-locating the dispensing head and manifold in the first container; and thirdly evacuating excess solvent from the dispensing head and manifold.

14. The method as claimed in claim 13 wherein the manifold includes a single tube splitting at a junction into two tubes, the two tubes being connected at their respective opposite ends to the dispensing head.

15. The method as claimed in claim 14 wherein a connection with the dispensing head is at a location towards the respective ends of the dispensing head.

16. The method as claimed in claim 3 wherein the manifold is connected to the solvent pump line and includes channels and connectors to the dispensing head, the channels and connectors having different branches, and wherein the channels include a first channel, branching to two secondary channels, and wherein each secondary channel branches in turn to two tertiary channels, and wherein the four tertiary channels are attached to the dispensing head, and wherein at least some of the junctions between adjacent channels are formed in a non-right-angular relationship with adjacent channels.

17. The method as claimed in claim 16 wherein the manifold comprises a center block and a plurality of side blocks having channels within, the center block being connected to the solvent pump line, and wherein a first channel branches to two secondary channels within the center block, each secondary channel being connected to a side block and branching in turn to two tertiary channels within the side block, the four tertiary channels being connected to the dispensing head, and wherein at least some of the junctions between adjacent channels are formed in the absence of a right-angular relationship with adjacent channels.

18. The method as claimed in claim 13 wherein an outlet system includes a flow path having the solvent pump line attached to a manifold leading to the dispensing head, the manifold including connectors between the channels and with the absence of 90° elbows in the flow path.

* * * * *